United States Patent [19]

Jackson

[11] Patent Number: 4,542,577
[45] Date of Patent: Sep. 24, 1985

[54] SUBMICRON CONDUCTOR MANUFACTURING

[75] Inventor: Thomas N. Jackson, Ossining, N.Y.

[73] Assignee: International Business Machines Corporation, Armonk, N.Y.

[21] Appl. No.: 582,695

[22] Filed: Feb. 23, 1984

Related U.S. Application Data

[62] Division of Ser. No. 454,915, Dec. 30, 1982, abandoned.

[51] Int. Cl.[4] .................. H01L 21/28; H01L 21/283; H01L 21/302
[52] U.S. Cl. ........................................ 29/571; 29/579; 29/591; 29/576 B; 148/1.5; 357/22; 357/65; 427/89; 427/99; 427/91; 156/651
[58] Field of Search ................ 29/571, 578, 579, 591, 29/576 B; 148/1.5; 427/88, 89, 90, 91, 99; 156/649, 650, 651; 357/65, 68, 22

[56] References Cited

U.S. PATENT DOCUMENTS

| | | | |
|---|---|---|---|
| 3,387,360 | 6/1968 | Nakamura et al. | 29/579 |
| 3,914,857 | 10/1975 | Goser et al. | 29/579 |
| 3,967,365 | 7/1976 | Friedrich | 29/579 |
| 4,232,439 | 11/1980 | Shibata | 29/579 |
| 4,280,854 | 7/1981 | Shibata et al. | 148/1.5 |
| 4,354,896 | 10/1982 | Hunter et al. | 29/580 X |
| 4,358,340 | 11/1982 | Fu | 357/59 X |

FOREIGN PATENT DOCUMENTS 0057254 2/1981 European Pat. Off. .
0043943 1/1982 European Pat. Off. .

OTHER PUBLICATIONS

Speidell "A Simple Method for Fabricating Submicron Lines" J. Vac. Sch. Technol, 19(3), Sep./Oct. 1981, pp. 693–695.

Primary Examiner—Brian E. Hearn
Assistant Examiner—David A. Hey
Attorney, Agent, or Firm—Alvin J. Riddles

[57] ABSTRACT

A submicron conductor is formed by placing a metal member over an insulator both terminating at a common defined edge. An angularly deposited metal against the edge provides a broad metal conductor attached along the entire edge of a thin metal member which is positioned on the substrate on a narrow line with the width defined by the horizontal component of the angular deposition. A removal operation removes with respect to the vertical component of the angular deposition the excess angularly deposited metal and leaves a vertical, very narrow metal conductor having a horizontal metal over the dielectric in electrical and supporting contact along the entire length. The asymmetry of the conductor provides field effect transistor advantages.

6 Claims, 5 Drawing Figures

SUBMICRON CONDUCTOR MANUFACTURING

This is a division of application Ser. No. 454,915 filed 12/30/82, now abandoned.

TECHNICAL FIELD

The technical field of the invention is that of conductors, the dimensions of which can be reduced into the submicron range.

As the technology in electronic circuit fabrication reaches the point where large quantities of devices and conductors are being placed together in a single functional unit, such as an integrated circuit chip and corresponding wiring supporting substrate, the ability to make electrodes and conductors of sizes that are smaller than a micron is acquiring increased importance. The fabrication of the very small conductors required for this technology however, usually require elaborate processing techniques since these dimensions are at this state of the art beyond the tolerances that are achievable.

BACKGROUND ART

One technique currently receiving attention in the art achieves small dimensions and precise positioning by defining a vertical positioning location or line on the planar surface of the device substrate, angularly depositing conductive material or metal against the face of the vertical line which provides a thicker deposit against the face than on the horizontal and then removing the deposited material on the horizontal leaving the vertical portion of the deposited material. This technique achieves smaller dimensions than are directly attainable with the tolerances of the individual operations.

Very small dimensions have been achieved using the angular deposition technique applied under the developed overhang of a photoresist. This technique is described in the Journal of Vacuum Science and Technology, Vol. 19, No. 3, Sept./Oct. 1981, page 693. In this prior art technique, an undercut photoresist edge is provided with a metal film that is deposited at a low angle with respect to the substrate. The resulting metal film is thicker on the sidewall than on the horizontal surface. Thereafter, a metal etch can be used to remove the metal from the horizontal surfaces while leaving the metal on the photoresist sidewall. Lines with lengths as small as 600 Å are reported.

The angular deposition procedure however has certain disadvantages. Where the electrode being made has some length, the line quality is dependent on the quality of the resist edge against which the angular deposition took place. The resist is usually in photoresist. Defects in the quality may cause breaks. If low resistance is required, then it is necessary to make the aspect ratio, which is the height with respect to the width, large and this in turn makes a high but marginally supported line vulnerable to damage. Further connections to such a small line are difficult.

DISCLOSURE OF THE INVENTION

The invention provides a submicron width conductor having a broad metal electrode all along the length thereof which gives mechanical support, electrical conductivity and imperfection accommodation. The conductor is particularly useful in field effect transistor structures.

Figure 1:
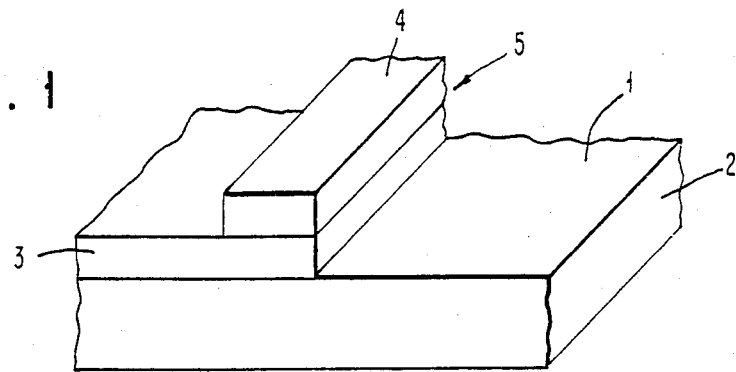
FIG. 1 illustrates the metal conductor and dielectric combination coterminating at an edge.

In accordance with the invention, referring to FIG. 1, on a planar surface 1 of a substrate 2 there are placed a position defining dielectric member 3 at least partially covered by an electrode metal 4 both of which coterminate at an electrode defining edge 5 that is essentially vertical with respect to the planar surface 1. The edge 5 can be positioned very precisely by such techniques as chemical and reactive ion etching. The electrode may be formed by deposition followed by anisotropic removal such as an etch or it may be preferably formed, referring to FIG. 2, by providing an angle 6 deposit of metal 7 against the edge 5. The metal 7, depending on the angle 6 chosen, will form a thicker portion 8 in the horizontal direction with respect to the planar surface 1 than along the plane of the surface 1. A removal operation, such as etching, will remove the metal 7 on the horizontal surfaces leaving an electrode of the portion 8 having a width determined by the thickness of the deposition along the edge 5, being supported along the height by the layers 3 and 4 and being contacted along the length by the metal layer 4. The submicron conductor is illustrated in FIG. 3 wherein the conductor itself is element 8 having a width (W) dimension governed by the location of the edge 5 and the thickness of the deposit, the height (H) dimension being governed by the thickness of the layers 3 and 4 combined, both of which support the conductor 8 so that higher aspect ratios or in other words ratios of height to width are achievable and all along the length (L) dimension the conductor 8 is electrically and mechanically bonded to the metal layer 4 at the edge 5 so that the electrical effect of discontinuities in the conductor 8 and imperfections in the dielectric 3 on the conductor 8 are minimized.

The conductor of the invention may be as small as less than 100 Å in width and may reach 1 micron. The conductor of the invention may be employed in any application wherein a very fine conductor that is precisely positioned is desired.

BEST MODE FOR CARRYING OUT THE INVENTION

A particularly valuable application is serving as the gate electrode in a short channel field effect transistor. In this application, the electrode 8 in FIG. 3 would be positioned between source and drain electrodes, not shown, formed in the substrate 2. Since the gate 8 is contacted continuously by the layer 4 along the top at the edge 5, small defects which cause breaks will not cause electrical discontinuity. The height to width aspect ratio can be very large since the gate 8 is supported for the full H dimension by the layers 3 and 4 so that the W dimension is not affected by the need for mechanical stability. Since the gate 8 is shorted electrically by the metal 4, the gate resistance of the field effect transistor device would be low.

The size of the metal layer 4 in a gate application of the conductor 8 will increase gate capacitance so that excessive width in the direction away from the edge 5 should be minimized. In order to enable one skilled in the art to have a starting point in accommodating this gate capacitance, the following specifications are provided. Considering the substrate in FIG. 3 to be GaAs, the conductor 8 gate line to be 0.5 micrometers wide and the dielectric layer 3 separating the metal layer 4 from the substrate 2 to be 0.5 micrometers and the layer 4 to be 1.0 micrometers wide and 1.0 micrometers thick, the gate capacitance would increase about 15% over a gate wherein the width and height dimensions are the same or 0.5 micrometers each yet the gate resistance would be reduced about 600%.

Referring to FIG. 1, a submicron gate metal semiconductor field effect transistor (MESFET) may be formed using as a substrate 2 a crystal of gallium arsenide, GaAs, wherein a region of the substrate 2 shown is of device conductivity doped, for example, n-type to a concentration of the order of $10^{17}$ atoms per cc. A dielectric layer 3 of silicon dioxide, $SiO_2$, of the order of 0.5 micrometers thick covered by a layer 4 of aluminum of the order of 1.0 micrometers thick, both layers coterminating at a gate position defining edge 5 located approximately midway on the substrate 2 between source and drain electrodes not shown. The layers 3 and 4 are positioned in accordance with standard deposition tolerances and a reactive ion etching operation is used to establish the location of the line 5 to within 0.5 micrometers.

Figure 2:
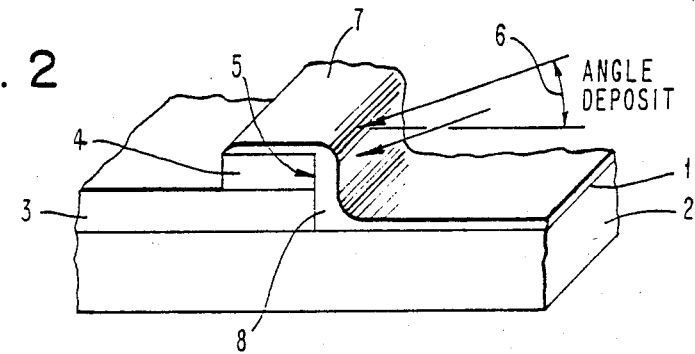
FIG. 2 illustrates the angle of deposit of conductor against the edge of the structure of FIG. 1.
Figure 3:
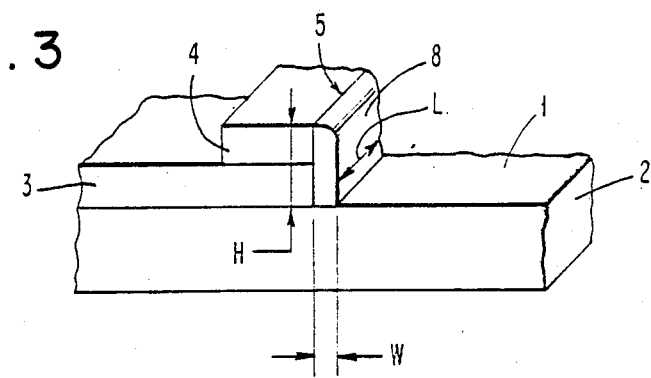
FIG. 3 illustrates the conductor of the invention.

Referring to FIG. 2, an angular deposition of a conductor such as the metal aluminum is directed to the edge 5 with the horizontal angle 6 at about 20 degrees whereby a thin deposit 7 occurs on the layer 4 and on the surfaces 1 and 3 and a thicker deposit 8 occurs on the edge 5 of the layers 3 and 4 with the layer 4 electrically contacting the deposited metal 8 along the length thereof.

Referring next to FIG. 3, an eroding operation removes the material over the surface 1 a corresponding amount over the layer 4 and conductor 8. The conductor 8 now has the width or edge dimension (W) in electrical conduction influencing relationship to the FET channel in the substrate 2, is supported by the layers 3 and 4 for the full height and is electrically shorted throughout the length thereof by the layer 4 which also serves as a broad area external electrode. For self-aligned FET structures, the material of the conductor 8 would preferably be of a refractory nature such as Ti, W or alloys such as Ti/W, Ti, W, Si or TiN.

Figure 4:
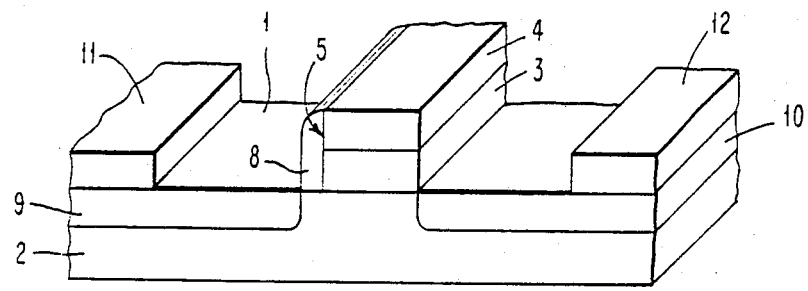
FIG. 4 illustrates one field effect transistor employing the invention.

Referring next to FIG. 4, there is shown a field effect transistor (FET) employing the invention. The structure has the same reference numerals as in FIGS. 1 to 3. In addition, in standard FET structural practice, the substrate 2 would have an n region adjacent the surface 1. An illustration of a standard FET structural practice is described in the 1981 IEEE International Solid-State Digest of Technical Papers, pages 218 and 219.

It should be noted that when the invention as shown in FIG. 4 is positioned with the electrode 8 oriented towards the FET source 9, an ion implantation step can be used to form a self-aligned FET as shown with n+ implanted regions 9 and 10 for the source and drain, respectively. These n+ implanted regions are contacted subsequently by electrodes 11 and 12, respectively.

The source resistance of the FET of FIG. 4 while reduced to a minimum has the advantage that the asymmetrical gate structure provided by the dielectric 3 covered by the metal 4 with electrode 8 operates to separate the gate from the drain n+ implanted region 10 allowing larger gate-to-drain voltages and therefore greater power output in microwave applications.

Figure 5:
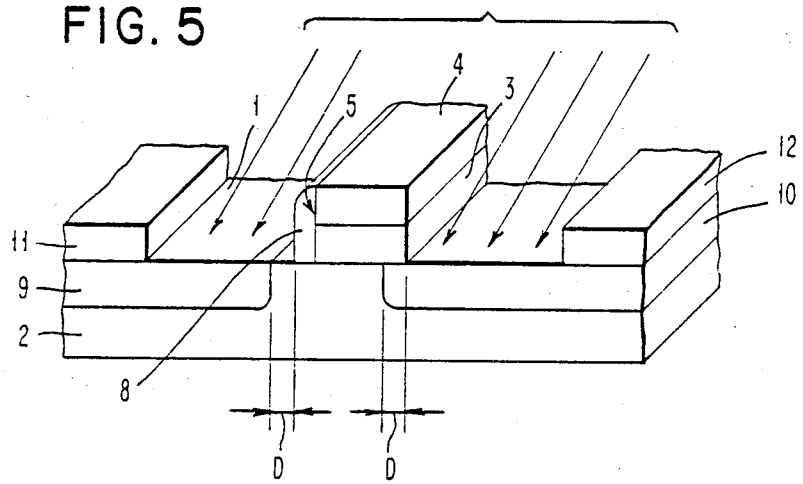
FIG. 5 illustrates another field effect transistor employing the invention.

Referring next to FIG. 5, there is shown another FET transistor employing the invention. In this structure, the source n+ implanted region 9 is moved away from the gate 8 by a dimension D to accommodate imprecision or inaccuracy in the source 9 position. The imprecision is due to ion implantation straggle or surface diffusion and can be a limit on short channel dimensions achievable in these devices. The angle implantation moves the drain region 10 a corresponding distance D under the dielectric 3 but with the asymmetrical conductor of the invention no problem is introduced.

What has been described is a submicron conductor applicable in situations where it is desirable to get a very small width and unlimited length, yet be connected to a fairly broad, low resistance supporting external connection. The conductor has asymmetry useful in field effect transistor applications.

Having thus described my invention, what I claim as new and desire to secure by Letters Patent is:

1. A process for manufacturing a selectable electrical resistance electrical conductor precisely positioned in electrical conduction influencing proximity to a substrate surface comprising in combination the steps of:
    applying a dielectric layer having a first thickness in contact with a substrate surface,
    applying a conductive layer having a second thickness over said dielectric layer,
    providing a common surface at a precise location on said substrate surface essentially perpendicular to said substrate surface of both said layers,
    depositing at an angle between said substrate surface direction and said essentially perpendicular common surface a conductive deposit whereby said conductive deposit exhibits a third thickness on said common surface and a fourth thickness on said substrate surface and on said conductive layer surface, and
    removing said conductive deposit at least to the extent of the deposit on said substrate surface.

2. The process of claim 1 wherein said removing said conductive deposit step involves removal to the depth of said fourth thickness.

3. The process of claim 1 wherein said providing step involves removal of a portion of said dielectric layer and said conductive layer along a line at a precise location on said substrate surface.

4. A self-aligned field effect transistor manufacturing process comprising in combination the steps of:
    applying a dielectric layer having a first thickness in contact with a substrate surface;
    applying a conductive layer having a second thickness over said dielectric layer;
    providing a common terminating surface of both said dielectric and said conductive layers at a precise location on said substrate surface essentially perpendicular to said substrate surface;
    depositing at an angle between said substrate surface direction and said essentially perpendicular common surface, a conductive deposit whereby said conductive deposit exhibits a third thickness on said common surface and a fourth thickness on said substrate surface and on said conductive layer surface;
    removing said conductive deposit at least to the extent of said fourth thickness on said substrate surface;

implanting conductivity impurities into said substrate surface positioning thereby a source region and a drain region, said source region being separated from the edge of said third thickness conductive deposit and applying ohmic external contacts to each of said source and drain regions.

5. The transistor manufacturing process of claim 4 wherein said implantation step is performed at an angle.

6. In a process of forming a low resistivity submicron electrode with an external connection along the length thereof on a substrate by angular deposition against a positioned surface essentially perpendicular to said substrate whereby there is provided a heavier mass of conductor perpendicular to the surface of said substrate than parallel to said substrate surface and the use of the difference between the horizontal and vertical to produce an edge defined vertical conductor structure, the improvement for external electrical connection purposes comprising the fabrication of said positioned surface against which said angular deposition is to take place of a first insulating layer adjacent the substrate surface covered by a second external electrical connection layer coterminating at said positioned surface.

* * * * *